United States Patent
Araki et al.

(10) Patent No.: US 6,621,117 B2
(45) Date of Patent: Sep. 16, 2003

(54) SEMICONDUCTOR DEVICE HAVING MEMORY CELL AND PERIPHERAL CIRCUITRY WITH DUMMY ELECTRODE

(75) Inventors: Yasuhiro Araki, Hyogo (JP); Satoshi Shimizu, Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/191,458

(22) Filed: Jul. 10, 2002

(65) Prior Publication Data

US 2003/0111671 A1 Jun. 19, 2003

(30) Foreign Application Priority Data

Dec. 14, 2001 (JP) .......................... 2001-381095

(51) Int. Cl.[7] ............................. H01L 29/788
(52) U.S. Cl. ................. 257/314; 257/315; 257/296; 257/392
(58) Field of Search ................. 257/314–320, 257/296, 392, 908; 438/201, 211, 257, 266, 260

(56) References Cited

U.S. PATENT DOCUMENTS 6,265,739 B1 * 7/2001 Yaegashi et al. ............. 257/296

FOREIGN PATENT DOCUMENTS

| JP | 10-229178 | | 8/1998 | |
| JP | 10229178 A | * | 8/1998 | ......... H01L/27/115 |
| JP | 2000-286350 | | 10/2000 | |

* cited by examiner

*Primary Examiner*—Carl Whitehead, Jr.
*Assistant Examiner*—Yennhu B. Huynh
(74) *Attorney, Agent, or Firm*—McDermott, Will & Emery

(57) ABSTRACT

A semiconductor device includes: a semiconductor substrate having a memory cell section and a peripheral circuit section defined in a plane; a floating gate electrode formed on semiconductor substrate in the memory cell section; a control gate electrode laminated thereabove; a gate electrode as a peripheral circuit electrode formed in one-layer-structure on semiconductor substrate in the peripheral circuit section; a first dummy electrode formed in the peripheral circuit section so as to have approximately same thickness as floating gate electrode; and a second dummy electrode laminated thereabove so as to have approximately same thickness as control gate electrode.

5 Claims, 7 Drawing Sheets

SEMICONDUCTOR DEVICE HAVING MEMORY CELL AND PERIPHERAL CIRCUITRY WITH DUMMY ELECTRODE

BACKGROUND OF THE INVENTION

1. Field of the Invention

The present invention relates to a semiconductor device including a flash memory and the like, and to a fabrication method therefor.

2. Description of the Background Art

Generally, a semiconductor device including a flash memory and the like has regions; a memory cell section and a peripheral circuit section on a surface of a semiconductor substrate thereof. Necessary electrodes and wirings are formed in each of the regions and furthermore, an isolation oxide film for use in electrically partitioning the surface of the semiconductor substrate is formed therein. Upon forming the isolation oxide film, there have been employed a trench isolation scheme (STI: Shallow Trench Isolation) and a LOCOS (Local Oxidation of Silicon) scheme. In a case where the isolation oxide film is fabricated by one of the schemes, a phenomenon called dishing in which a central part of an isolation oxide film is depressed sometimes occurs. FIG. 14 shows an example the dishing occurs. In the example of FIG. 14, the dishing occurs on isolation oxide film 2 formed on semiconductor substrate 1. Moreover, as shown in FIG. 15, as a result of locally forming gate electrodes 10 in a peripheral circuit section in order to fabricate transistors 4, there arise differences between heights of the top surfaces of the electrodes thereof above the surface of semiconductor substrate 1 in the peripheral circuit section.

In such a case where there exist a part in which dishing occurs and parts having largely different heights from each other, a level difference 6, as shown in FIG. 15, sometimes takes place on the top surface of an interlayer insulating film 5 formed on an area including the parts so as to cover thereon. Moreover, even if interlayer insulating film 5 was formed to be flat at first sight, a level difference sometimes occurs on the top surface of interlayer insulating film 5 revealed after a CMP (Chemical Mechanical Polishing) process conducted for planarization of the top surface of interlayer insulating film 5 at a stage prior to formation of a contact hole in interlayer insulating film 5 under an influence of a level difference of a structure below interlayer insulating film 5. It is problematic in subsequent steps to produce such a level difference on the top surface of interlayer insulating film 5.

In order to reduce a level difference produced on the top surface of interlayer insulating film 5 in the peripheral circuit section, it has been proposed to arrange dummy electrodes 13 in the neighborhood of each gate electrode 10 arranged in the peripheral circuit section as shown in FIG. 16. While an isolation oxide film is omitted in FIGS. 15 and 16, in a case where an isolation oxide film is available in the neighborhood of transistor 4, a scheme has been adopted in which isolation insulating film 2, as shown in FIG. 17, is divided into plural pieces of a size of the order at which dishing is hard to occur thereon to form dummy electrodes 13 so as to span dummy electrodes.

On the other hand, in a case where a flash memory 3 is placed in the memory cell section, flash memory 3 adopts a two-layer structure as shown in FIG. 16 obtained by stacking a floating electrode 11 and a control gate 12 on semiconductor substrate. In contrast to this, in the peripheral circuit section, electrodes are only of a single layer structure; therefore parts of the electrodes in the peripheral circuit section have been lower as compared with parts of the two-layer structures in the memory cell section, though with a reduced level difference 6. As a result, a level difference 7 has remained between the memory cell section and the peripheral circuit section.

SUMMARY OF THE INVENTION

It is an object of the present invention to provide a semiconductor device having a structure capable of further reducing a level difference produced on the top surface of an interlayer insulating film, and a fabrication method therefor.

In order to achieve the above-mentioned object, one aspect of a semiconductor device according to the present invention includes: a semiconductor substrate having a memory cell section and a peripheral circuit section defined in a plane; a floating gate electrode formed on the semiconductor substrate in the memory cell section; a control gate electrode laminated above the floating gate electrode; a peripheral circuit electrode formed in one-layer-structure on the semiconductor substrate in the peripheral circuit section; a first dummy electrode formed on the semiconductor substrate in the peripheral circuit section so as to have approximately same thickness as the floating gate electrode; and a second dummy electrode laminated above the first dummy electrode so as to have approximately same thickness as the control gate electrode. With the construction adopted, a composite dummy electrode is also provided in a two-layer structure in the peripheral circuit section in a manner similar to a two-layer structure of a composite electrode for use in a flash memory and the like in the memory cell section, therefore, enabling reduction in a level difference on the top surface of an interlayer insulating film formed on the top sides of the memory cell section and the peripheral circuit section.

In order to achieve the object, another aspect of the semiconductor device according to the present invention includes: a semiconductor substrate having a memory cell section and a peripheral circuit section defined in a plane; a floating gate electrode formed on the semiconductor substrate in the memory cell section; a control gate electrode laminated above the floating gate electrode; a peripheral circuit electrode formed in one-layer-structure on said semiconductor substrate in the peripheral circuit section; a contact receiving portion formed on the semiconductor substrate in the peripheral circuit section, and connected to the peripheral circuit electrode; and a third dummy electrode formed between the contact receiving portion and the semiconductor substrate. With the construction adopted, the third dummy electrode interposes below the contact receiving portion to thereby form a two layer structure at the contact receiving portion and to ensure a height of the contact receiving portion to be the same as that of the composite electrode of a two-layer structure for use in a flash memory and others in the memory cell section, thereby reducing a level difference produced on the top surface of the interlayer insulating film.

In order to achieve the object, a fabrication method for a semiconductor device according to the present invention is directed to a method for fabricating a semiconductor device which includes a semiconductor substrate having a memory cell section and a peripheral circuit section defined in a plane; wherein the memory cell section having a floating gate electrode and a control gate electrode; wherein the peripheral circuit section having a gate electrode in one-layer-structure and dummy electrodes in two-layerstructure; and includes the following steps: a first conductive layer forming step of collectively forming a first conductive layer including a portion to be served as a floating gate electrode in a memory cell section, across the memory cell section and the peripheral circuit section; a second conductive layer forming step of collectively forming a second conductive layer including a portion to be served as a control gate electrode laminated above the floating gate electrode in the memory cell section above the first conductive layer, across the memory cell section and the peripheral circuit section; a first conductive layer patterning step of patterning not only the floating gate electrode on the first conductive layer at a portion thereof located in the memory cell section, but also the first dummy electrode on the first conductive layer at a portion thereof located in the peripheral circuit section; and a second conductive layer patterning step of patterning not only the control gate electrode on the second conductive layer at a portion thereof located in the memory cell section, but also the second dummy electrode on the second conductive layer at a portion thereof located in the peripheral circuit section; and a step of forming interlayer insulating film to cover the memory cell section and the peripheral circuit section collectively. With the method adopted, the same layer laminating step and the same etching step can be used commonly for the first and second conductive layers to thereby form the composite electrode in the memory cell section and the composite dummy electrode in the peripheral circuit section in parallel; therefore, enabling achievement of a construction with a composite dummy electrode without increasing useless steps.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

First Embodiment

Figure 1:
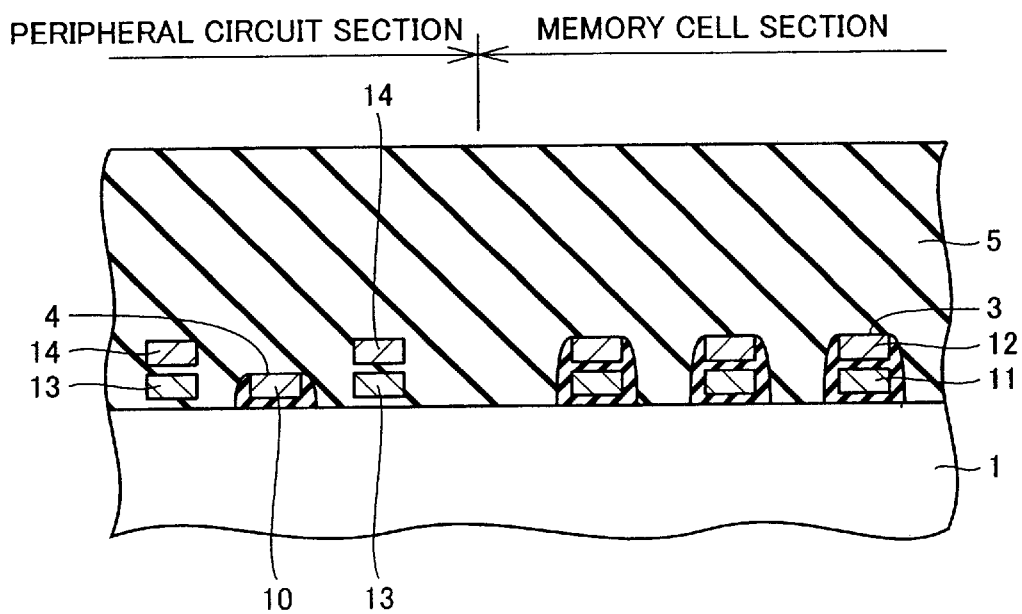
FIG. 1 is a sectional view of a semiconductor device in a first embodiment according to the present invention.

Referring to FIG. 1, description will be given of a construction of a semiconductor device in the first embodiment of the present invention. The semiconductor device, as shown in FIG. 1, has a construction in which elements are formed on a surface of a semiconductor substrate 1 made of silicon. A memory cell section and a peripheral circuit section are defined on the surface of semiconductor substrate 1 as planar regions. A flash memory 3 is formed in the memory cell section. In the interior of flash memory 3, a floating gate 11 is laminated on the surface of semiconductor substrate 1 with a tunnel oxide film interposing therebetween and a control gate electrode 12 is laminated thereon with an insulating film such as a film of a three-layer structure including an oxide film, a nitride film and an oxide film (hereinafter referred to as "ONO film") therebetween. That is, focusing attention to only the electrodes in the memory cell section, a composite electrode is of a two-layer structure constructed of floating gate electrode 11 and control gate electrode 12. On the other hand, in the peripheral circuit section, a transistor is formed. Transistor 4 includes a gate electrode 10, which is of a single layer structure. Note that in FIG. 1, the elements are shown in a simplified fashion omitting details of a structure. Moreover, in FIG. 1, there is not shown an isolation oxide film formed on the surface of semiconductor substrate 1.

In the peripheral circuit section of the semiconductor device, a two-layer structure including a first dummy electrode 13 and a second dummy electrode 14 is arranged around transistor 4. First dummy electrode 13 is formed of the same material and to approximately same thickness as floating gate electrode 11. Second dummy electrode 14 is formed of the same material and to approximately same thickness as control gate electrode 12.

Figure 2:
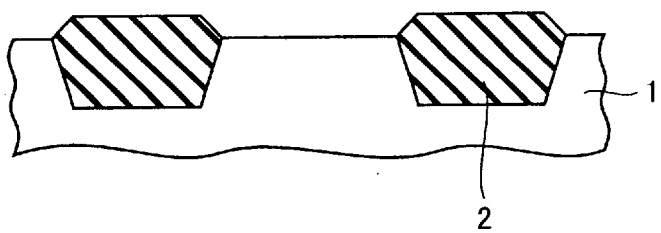
FIG. 2 is an explanation view showing a first step of a fabrication method for the semiconductor device in a first embodiment according to the present invention.
Figure 3:
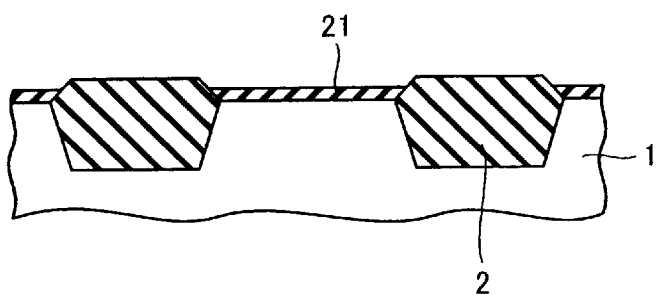
FIG. 3 is an explanation view showing a second step of the fabrication method for the semiconductor device in the first embodiment according to the present invention.

Description will be given of a fabrication method for the semiconductor device shown in FIG. 1 with reference to FIGS. 2 to 9. As shown in FIG. 2, a prescribed isolation oxide film 2 is formed on the surface of semiconductor substrate 1 using a trench isolation scheme or a LOCOS scheme. Note that FIG. 2 shows an enlarged view of a site where a composite dummy electrode is placed in the vicinity of a transistor in the peripheral circuit section. As shown in FIG. 3, a tunnel oxide film 21 is formed on an exposed portion of semiconductor substrate 1, such as a clearance between isolation films 2. Tunnel oxide film 21 is also formed at the same time that a tunnel oxide film is formed in the memory cell section.

Figure 4:
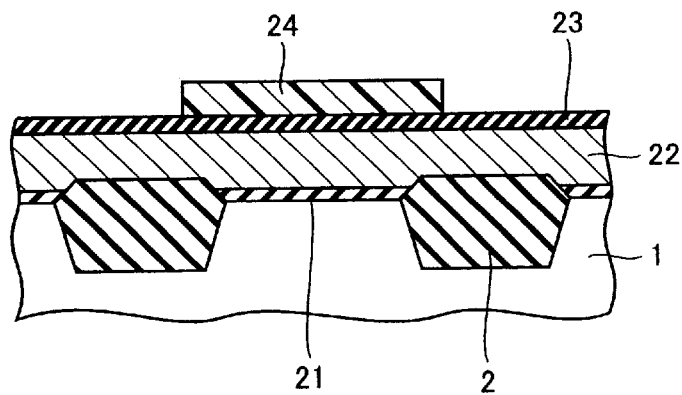
FIG. 4 is an explanation view showing a third step of the fabrication method for the semiconductor device in the first embodiment according to the present invention.

In a first conductive layer forming step, as shown in FIG. 4, a first conductive layer 22 is formed on a major surface of semiconductor substrate 1 so as to cover isolation oxide film 2 and tunnel oxide film 21. First conductive layer 22 is a layer of a material for forming floating gate electrode 11 in the memory cell section and is also laminated in the peripheral circuit section at the same time as in the memory cell section. Moreover, an ONO film 23 is formed so as to cover the top surface of first conductive layer 22. ONO film 23 is also laminated in the peripheral circuit section at the same time as on the top side of floating gate electrode 11 in the memory cell section. Moreover, a photoresist 24 is formed on the top side of ONO film 23. Photoresist film 24 is exposed according to a photolithographic technique and developed into a pattern corresponding to a shape of first dummy electrode 13 to be formed. In the example shown in FIG. 4, photoresist 24 is formed in a region spanning two isolation oxide films 2.

Figure 5:
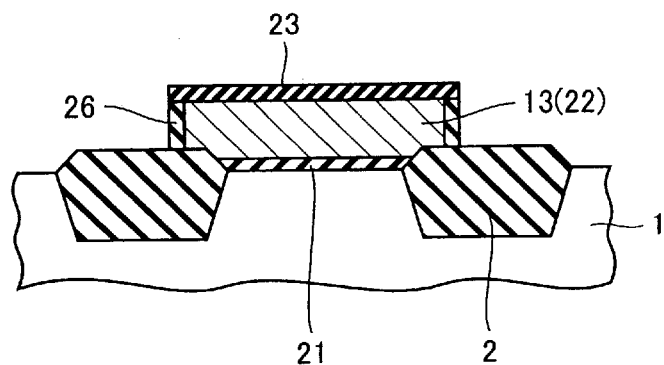
FIG. 5 is an explanation view showing a fourth step of the fabrication method for the semiconductor device in the first embodiment according to the present invention.
Figure 6:
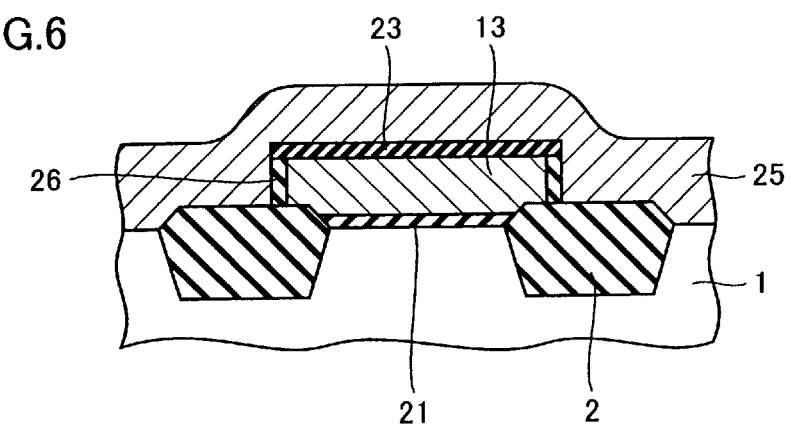
FIG. 6 is an explanation view showing a fifth step of the fabrication method for the semiconductor device in the first embodiment according to the present invention.
Figure 7:
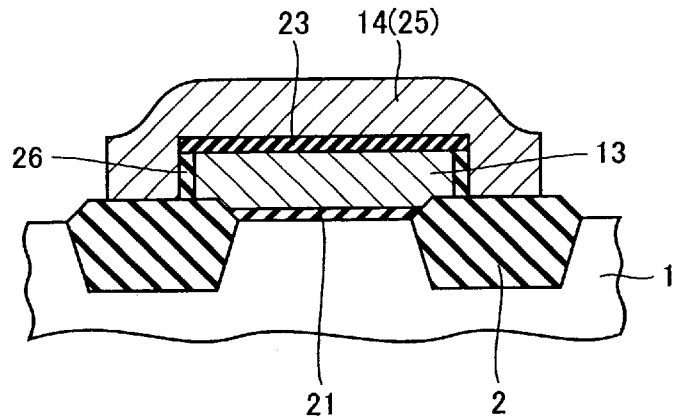
FIG. 7 is an explanation view showing a sixth step of the fabrication method for the semiconductor device in the first embodiment according to the present invention.

In a first conductive layer patterning step, etching is performed with photoresist 24 as a mask to form first dummy electrode 13 by leaving a desired portion of first conductive layer 22 as is as shown in FIG. 5. At the same time, ONO film 23 on the top side of first dummy electrode 13 is also patterned. The etching is simultaneously performed as an additional role for patterning floating gate electrode 11 in the memory cell section. An oxide film 26 is formed on a newly exposed sidewall of first dummy electrode 13. In a second conductive layer forming step, as shown in FIG. 6, a second conductive layer 25 is formed so as to cover patterned first dummy electrode 13, ONO film 23 on the top surface thereof and oxide film 26 on the sidewall. Second conductive layer 25 is a layer of a material for forming control gate electrode 12 in the memory cell section and also laminated in the peripheral circuit section at the same time as in the memory cell section. In second conductive layer patterning step, a photolithographic technique is further repeated on second conductive layer 25 to form second dummy electrode 14 as shown in FIG. 7. Etching for forming second dummy electrode 14 is simultaneously performed as an additional role for patterning control gate electrode 12 in the memory cell section. By doing so, a two-layer structure including first dummy electrode 13 and second dummy electrode 14 is obtained in the peripheral circuit section.

In the semiconductor device, since a composite dummy electrode is also arranged as a two-layer structure in the peripheral circuit section in a manner similar to a two-layer structure of a composite electrode for a flash memory and others in the memory cell section, a level difference between the peripheral section and the memory cell section is almost nothing.

Therefore, a level difference on the top surface of an interlayer insulating film can be reduced in a case where the interlayer insulating film is laminated on the top sides of the memory cell section and the peripheral circuit section.

While in FIG. 1, first dummy electrode 13 and second dummy electrode 14 are shown so as to be of the same size as each other and constitutes a two-layer structure, the two-layer structure may be actually formed such that second dummy electrode 14 covers first dummy electrode 13 on the top and side surfaces thereof, as shown in FIG. 7. With such a structure, a highly reliable semiconductor device which suffers less damage in etching to form second dummy electrode 14.

Figure 8:
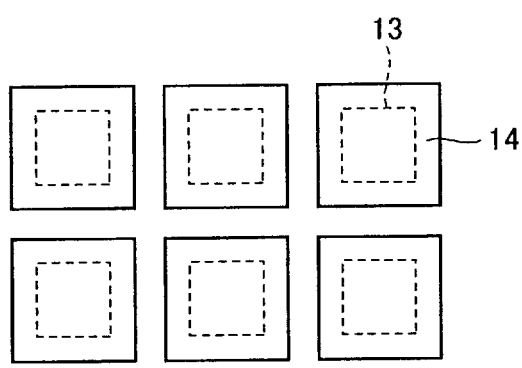
FIG. 8 is a plan view showing an arrangement of dummy electrodes of the semiconductor device in the first embodiment according to the present invention.

In FIG. 8, there is shown a top view of the two-layer structures. Though a two-layer structure including first dummy electrode 13 and second dummy electrode 14 may be placed in an extended line as in a prior art transistor 4, it is preferable that plural independent shapes of approximately a quadrangle in segmented short lengths are disposed in an arrangement with spaces between quadrangular shapes. This is because with such an arrangement, a high opening proportion is ensured in etching of first dummy electrode 13, leading to efficient etching. Note that while a shape of the two-layer structure of each composite dummy electrode is here approximately a quadrangle, other shapes than approximately an quadrangle may be adopted as far as the other shapes can be arranged in a given region at spaces therebetween. In the example shown in FIG. 7, first and second dummy electrode 13, 14 are formed not only lying in active area of semiconductor substrate 1 but also partly covering over isolation insulating film 2. However, it is preferable that first and second dummy electrode 13, 14 are not covering over isolation insulating film 2 at all but are formed within the area above active area of semiconductor substrate 1 (area wherein semiconductor substrate is bare), because a level difference in a peripheral circuit section will be reduced.

Figure 9:
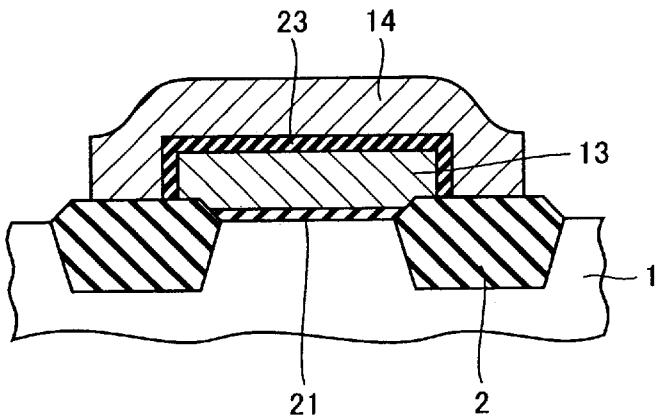
FIG. 9 is a sectional view of another example of the semiconductor device in the first embodiment according to the present invention.

While in the above description, there is shown the example in which patterning is performed collectively on first conductive layer 22 and ONO film 23 laminated on the top surface thereof after stacking ONO film 23, an alternative sequence may be adopted in which only first conductive layer 22 is patterned prior to stacking of ONO film 23, followed by formation of ONO film 23 so as to cover the top and side surfaces of first dummy electrode 13 obtained. In this case, a structure shown in FIG. 9 is eventually obtained. A structure may be adopted in which the side surface of first dummy electrode 13 is also covered by ONO film 23.

According to a fabrication method for a semiconductor device in this embodiment, a step of forming a floating gate electrode and a control gate electrode in the memory cell section is used to enable a composite dummy electrode to be formed simultaneously in parallel with good efficiency.

Second Embodiment

Figure 10:
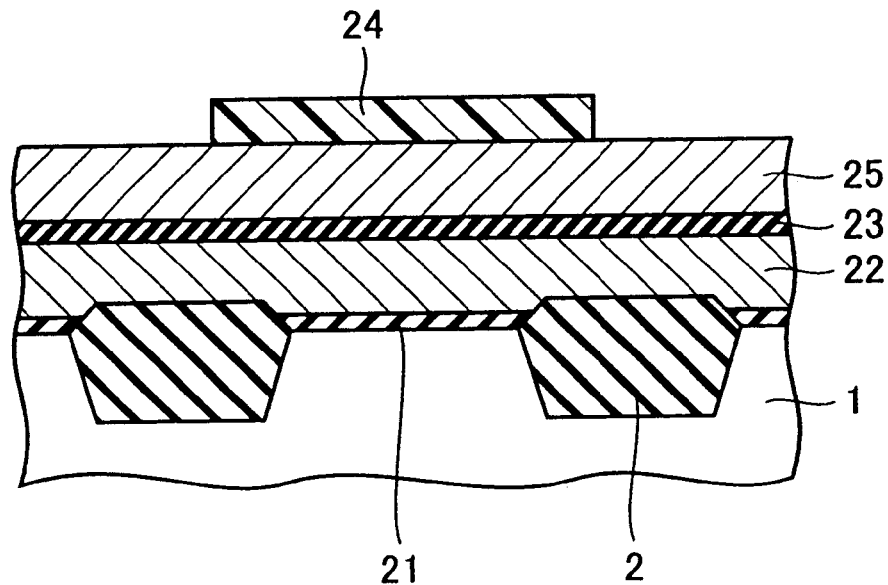
FIG. 10 is an explanation view showing a third step of a fabrication method of a semiconductor device in a second embodiment according to the present invention.

Description will be given of a fabrication method for a semiconductor device in the second embodiment according to the present invention. The steps shown in FIGS. 1 to 3 are the same as corresponding steps in the first embodiment. Moreover, the steps as far as formation of ONO film 23 are the same as described in the first embodiment. In addition, in the second conductive layer forming step, as shown in FIG. 10, a second conductive layer 25 is formed so as to cover the top surface of ONO film 23. Second conductive layer 25 is a layer of a material for forming control gate electrode 12 in the memory cell section and is also laminated in the peripheral circuit section as the same time as in the memory cell section. Photoresist 24 is formed on the top side of second conductive layer 25. Photoresist 24 is exposed according to a photolithographic technique and developed into a pattern corresponding to a shape of a laminated structure of a composite dummy electrode to be formed. In an example shown in FIG. 10, photoresist 24 is formed in a region spanning two isolation oxide films 2.

Figure 11:
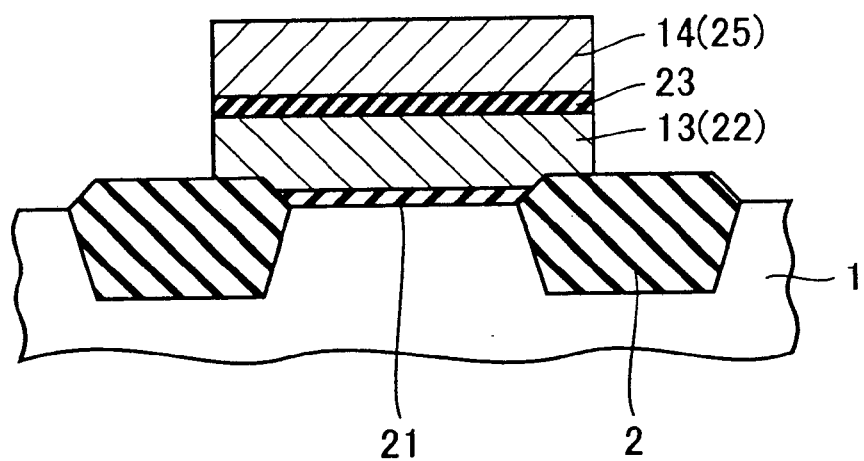
FIG. 11 is an explanation view showing a fourth step of the fabrication method of a semiconductor device in the second embodiment according to the present invention.

Photoresist 24 is used as a mask to perform etching in the first and second conductive layer patterning steps simultaneously and as shown in FIG. 11, tunnel oxide film 21, first conductive layer 22, ONO film 23 and second conductive layer 25 are collectively patterned. The etching is performed at the same time as in patterning floating gate electrode 11 and control gate electrode 12 in the memory cell section. In such a way, there is obtained a two-layer structure including first dummy electrode 13 and second dummy electrode 14.

With the fabrication method adopted, the effect described in the first embodiment can be attained. Moreover, in the fabrication method, etching can be sufficiently performed once, thereby enabling the number of steps to decrease.

Third Embodiment

Figure 12:
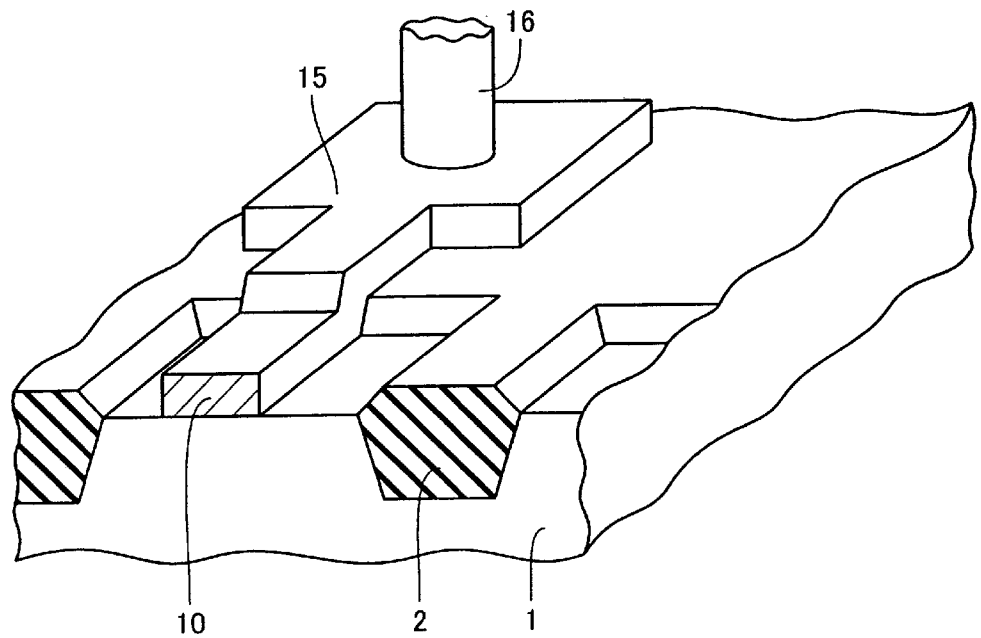
FIG. 12 is a perspective view of a semiconductor device in a third embodiment according to the present invention.
Figure 13:
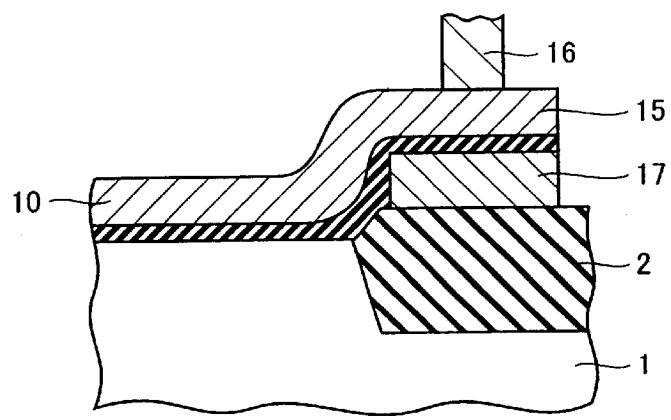
FIG. 13 is a partial sectional view of the semiconductor device in the third embodiment according to the present invention.
Figure 14:
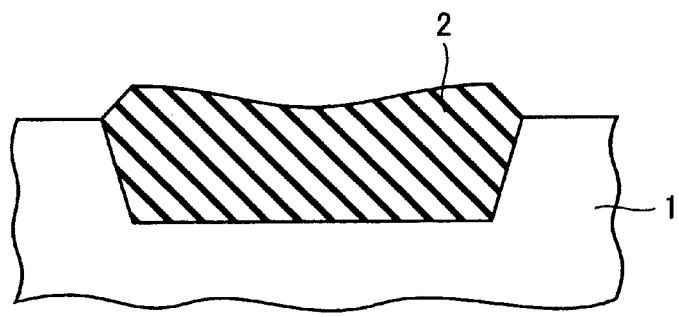
FIG. 14 is a sectional view of a state in which dishing occurs of a semiconductor device according to a prior art.
Figure 15:
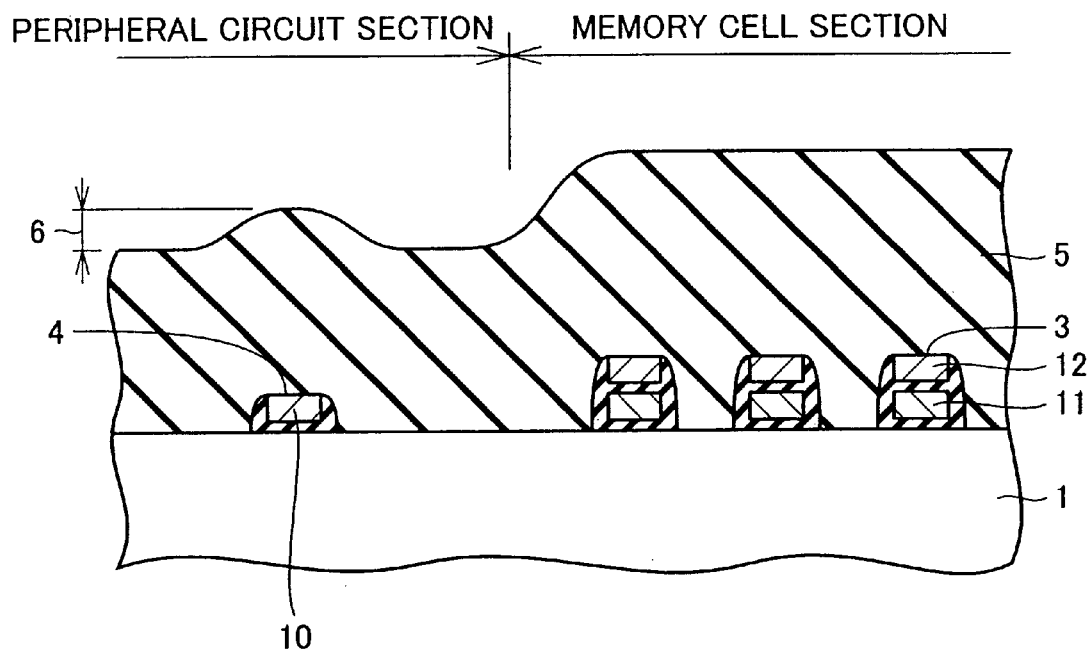
FIG. 15 is a sectional view of a first example of the semiconductor device according to the prior art.
Figure 16:
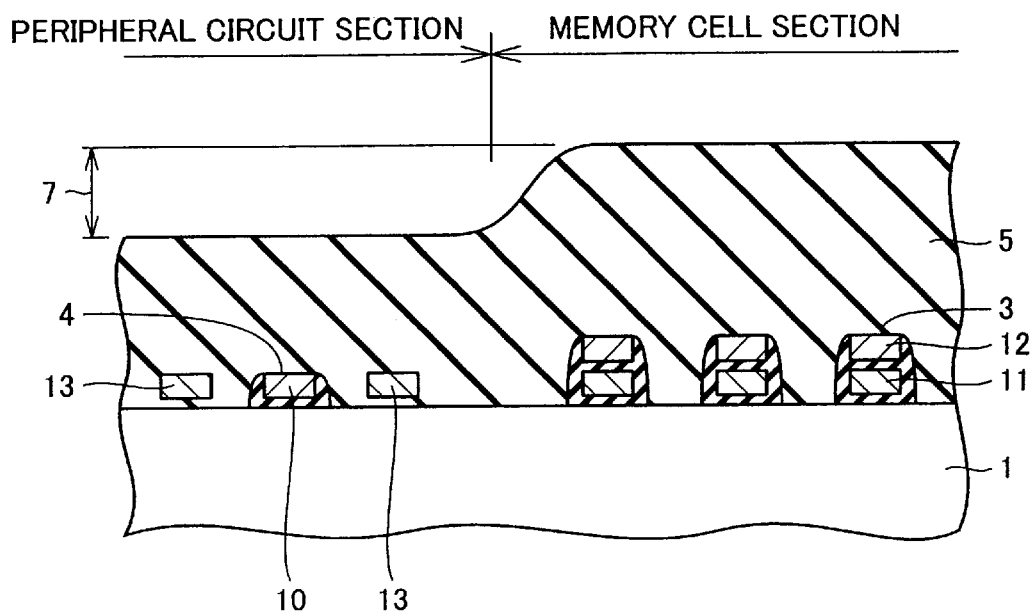
FIG. 16 is a sectional view of a second example of the semiconductor device according to the prior art.
Figure 17:
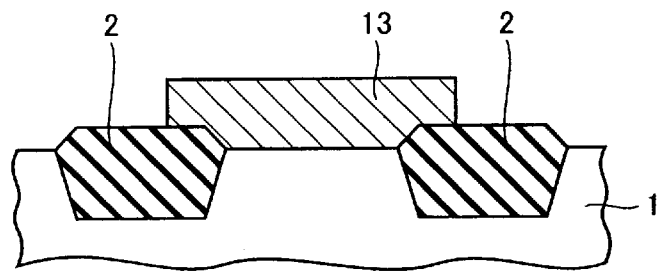
FIG. 17 is a sectional view showing an arrangement of isolation oxide films in the semiconductor device according to the prior art.

Referring to FIGS. 12 and 13, description will be given of a construction of a semiconductor device in the third embodiment based on he present invention. In FIG. 12, there is shown an enlarged perspective view of part of the peripheral circuit section. A section is placed in front of the viewer so as to facilitate understanding of a structure. Gate electrode 10 of transistor 4 (see FIG. 1) extends in a line as shown in FIG. 12 and a contact receiving portion 15 is located at the distal end thereof. Contact receiving portion 15 spreads somewhat broadly in a plane, to which a contact 16 is connected, coming down from above. While in FIG. 12, only a major part is shown for easy understanding, insulating films and others are actually arranged on the top and bottom surface and side surface of gate electrode 10 and interlayer insulating film 5 (see FIG. 1) covers them. Contact 16 is connected to contact receiving portion 15 in a manner so as to pass through the bulk of interlayer insulating film 5. In FIG. 13, there is shown a partial sectional view of the semiconductor device in the vicinity of contact receiving portion 15. FIG. 13 omits interlayer insulating film 5. In the semiconductor device in this embodiment, contact receiving portion is placed on isolation insulating film 2 and third dummy electrode 17 is sandwiched between isolation insulating film 2 and contact receiving portion 15.

In a prior art case where a transistor in the peripheral circuit section had an electrode of a single-layer structure, a part of a transistor extending in a line stayed in a single-layer structure and contact receiving portion 15 located at the distal end of the transistor similarly stayed in a single-layer structure, even if a composite dummy electrode of a two-layer structure in the first embodiment was provided. Therefore, a level difference had a chance to be produced on the top surface of interlayer insulating film 5 due a difference in height between a part of contact receiving portion 15 and a two-layer structure of a composite electrode in the memory cell section.

In a semiconductor device of this embodiment, however, by interposing third dummy electrode 17 below contact receiving portion 15, a part of contact receiving portion 15 assumes the same height as the two-layer structure of a composite electrode of the memory cell section since the part of contact receiving portion 15 is also of a two-layer structure, thereby enabling reduction in level difference produced on the top surface of an interlayer insulating film. By forming third electrode 17 at the same time that floating gate electrode in the memory cell section is formed, useless steps that would otherwise be specially used in formation of third dummy electrode 17 are required no longer, leading to good efficiency.

According to the present invention, since a composite dummy electrode is provided as a two-layer structure in the peripheral circuit section as well in a manner similar to a two-layer structure of a flash memory and others in the memory cell section, reduction can be achieved in level difference on the top surface of an interlayer insulating film laminated on the top sides of the memory cell section and the peripheral circuit. Moreover, since a two-layer structure is realized in a contact receiving portion as well by interposing a dummy electrode, reduction can also be achieved in level difference produced on the top surface of an interlayer insulating film on the contact receiving portion.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device comprising:

a semiconductor substrate having a memory cell section and a peripheral circuit section defined in a plane;

a floating gate electrode formed in one-layer-structure on said semiconductor substrate in said memory cell section;

a control gate electrode laminated above said floating gate electrode;

a peripheral circuit electrode formed in one-layer-structure on said semiconductor substrate in said peripheral circuit section;

a first dummy electrode formed on said semiconductor substrate in said peripheral circuit section so as to have approximately same thickness as said floating gate electrode; and a second dummy electrode laminated above said first dummy electrode so as to have approximately same thickness as said control gate electrode, wherein:

said first dummy electrode and said second dummy electrode are placed within the area above an area of said semiconductor substrate;

said peripheral circuit section has a plurality of active regions and an isolation region isolating said active regions from each other;

said memory cell section has an active region; and said floating gate electrode and said control gate electrode are within said active region of said memory cell section.

2. The semiconductor device according to claim 1, wherein a plurality of two-layer structures consisting of said first dummy electrode and said second dummy electrode exist in a substantially quadrangle shape when viewed in a plane, and are arranged with spaces therebetween.

3. The semiconductor device according to claim 2, wherein said second dummy electrode covers top and side surface of said first dummy electrode.

4. A semiconductor device comprising:

a semiconductor substrate having a memory cell section and a peripheral circuit section defined in a plane;

a floating gate electrode formed in one-layer-structure on said semiconductor substrate in said memory cell section;

a control gate electrode laminated above said floating gate electrode;

a peripheral circuit electrode formed in one-layer-structure on said semiconductor substrate in said peripheral circuit section;

a first dummy electrode formed on said semiconductor substrate in said peripheral circuit section so as to have approximately same thickness as said floating gate electrode;

a second dummy electrode laminated above said first dummy electrode so as to have approximately same thickness as said control gate electrode;

a contact receiving portion formed on said semiconductor substrate in said peripheral circuit section, and connected to said peripheral circuit electrode; and a third dummy electrode formed between said contact receiving portion and said semiconductor substrate.

5. A semiconductor device comprising:

a semiconductor substrate having a memory cell section and a peripheral circuit section defined in a plane;

a floating gate electrode formed on said semiconductor substrate in said memory cell section;

a control gate electrode laminated above said floating gate electrode;

a peripheral circuit electrode formed in one-layer-structure on said semiconductor substrate in said peripheral circuit section;

a contact receiving portion formed on said semiconductor substrate in said peripheral circuit section, and connected to said peripheral circuit electrode; and a dummy electrode formed between said contact receiving portion and said semiconductor substrate.

* * * * *